United States Patent [19]
Black et al.

[11] Patent Number: 5,278,994
[45] Date of Patent: Jan. 11, 1994

[54] POWER AMPLIFIER SATURATION DETECTION AND CORRECTION METHOD AND APPARATUS

[75] Inventors: Gregory R. Black, Vernon Hills; Alexander W. Hietala, Cary, both of Ill.

[73] Assignee: Motorola, Inc., Schaumburg, Ill.

[21] Appl. No.: 709,737

[22] Filed: Jun. 3, 1991

[51] Int. Cl.$^5$ ............................ H04B 1/04; H03G 3/20
[52] U.S. Cl. ...................................... 455/126; 330/278; 455/115
[58] Field of Search ................ 455/115–117, 126, 127; 330/278, 207P, 298

[56] References Cited

U.S. PATENT DOCUMENTS

| | | | |
|---|---|---|---|
| 4,114,108 | 9/1978 | Faulkenberry et al. | 330/207 P |
| 4,367,443 | 1/1983 | Hull et al. | |
| 4,602,218 | 7/1986 | Vilmur et al. | |
| 4,727,337 | 2/1988 | Jason | 330/298 |
| 4,945,314 | 7/1990 | Van Den Bungelaar | 330/279 X |

FOREIGN PATENT DOCUMENTS

| | | | |
|---|---|---|---|
| 0415503 | 3/1991 | European Pat. Off. | 330/279 |
| 0139425 | 6/1987 | Japan | 425/126 |

*Primary Examiner*—Reinhard J. Eisenzopf
*Assistant Examiner*—Chi Pham
*Attorney, Agent, or Firm*—Kirk W. Dailey; F. John Motsinger; Rolland R. Hackbart

[57] ABSTRACT

A power amplifier controller for detecting saturation of the power amplifier (203) and corrects the automatic output control voltage (231) to avoid any further saturation. A detector (211) detects the power of the radio frequency (RF) output signal (211) and generates a signal (229) correlated to the detected power. Comparator (217) compares changes in that signal (229) to changes in the voltage of the AOC signal (231). The comparator (217) generates a signal (233) correlated to saturation of the power amplifier (203) for a DSP (223). The DSP (223) checks the status of this signal (233). Upon detecting saturation, an algorithm contained within the DSP methodically reduces the voltage of the AOC signal (231) until there is a change in the power of the RF output signal (211).

7 Claims, 5 Drawing Sheets

| POWER LEVEL | MAXIMUM LEVEL MEASURED | | | |
|---|---|---|---|---|
| | 400kHz | 600kHz | 1200kHz | 1800kHz |
| 43 dbm | -17 dbm | -26 dbm | -32 dbm | -36 dbm |
| 41 dbm | -19 dbm | -26 dbm | -32 dbm | -36 dbm |
| 39 dbm | -21 dbm | -26 dbm | -32 dbm | -36 dbm |
| <37 dbm | -23 dbm | -26 dbm | -32 dbm | -36 dbm |

POWER AMPLIFIER SATURATION DETECTION AND CORRECTION METHOD AND APPARATUS

FIELD OF THE INVENTION

Generally, this invention relates to power amplifier control circuits. More specifically, this invention relates to saturation detection and control for power amplifiers.

BACKGROUND OF THE INVENTION

The use of power amplifiers in transmitting radio frequencies (RF) signals has many applications, including but not limited to radiotelephone communications systems. In a radiotelephone communications system, there are multiple fixed site transceivers. Each fixed site transceiver is an interface between the line telephone system and multiple, portable, or mobile radiotelephone systems contained within a geographic area served by the fixed site transceiver. The fixed site transceiver and the radiotelephone communicate by sending and receiving FM modulated radio frequency signals to each other.

In an analog radiotelephone system, there is a large available RF spectrum available for radiotelephone communications. The available RF spectrum is channelized into relatively narrow segments of frequency. Upon request, each radiotelephone is allocated a frequency channel upon which to broadcast and receive information from the fixed site transceiver. This is known as a Frequency Division Multiple Access (FDMA) system. During a phone call, the radiotelephone transmitter would turn-on and remain on the fixed frequency for the entire time of the phone call. Thus, the transmitter and subsequently the power amplifier (PA) of the radiotelephone only needed to turn-on once and turn-off once for a given phone call which could last several minutes. The fixed site transceiver could also remain on for the duration of a phone call. In an FDMA system, since there are a limited number of turn-ons, the turn-on and turn-off requirements of the power amplifier are not very stringent. If a transmitter is turned on quickly, there is a momentary large burst of noise, however, since this would only occur once during a conversation, it would not substantively affect the communication system. Similarly, if the power amplifier is turned on slowly, there would be an imperceptible gap in the conversation at the beginning of a phone call. These problems are only inconveniences to the user and are not substantive system degrading problems.

In the newly proposed digital cellular radiotelephone systems, the power amplifier turn-on requirements have increased dramatically. The new systems use a time division multiple access (TDMA) communications system. In a TDMA communications system, 8 or 16 radiotelephones share a single 200 kilohertz wide channel on which to broadcast. Each radiotelephone in a channel is allocated one 577 microsecond (uS) time slot on a repetitive basis. During this time slot the radiotelephone ramps up the power amplifier to the proper frequency and power, sends the desired data, and ramps down the power amplifier so as not to disturb or interfere with the other users sharing the same frequency. Thus, the requirements for controlling the power amplifier are greatly increased.

The Group Special mobile (GSM) recommendations ETSI/PT-12 05.05 (4.2.2 and 4.5.2), March, 1991 were developed to define a digital radiotelephone communications system. These recommendations were aware of the increased power amplifier requirements and have defined a time mask and a spectral frequency mask, as illustrated in FIGS. 7 and 8, which all radiotelephone equipment used in the system must meet. The specifications concerning the time and frequency masks demand the development of a very smooth ramp up of the PA under stringent time constraints.

Saturation of a power amplifier occurs when the power amplifier cannot produce as much power as the control circuitry demands. Saturation may be caused by decreased availability of battery voltage in a portable radiotelephone or environmental temperature extremes. Saturation of the power amplifier can cause two problems. Namely, the saturated power amplifier may damage some properties of the power amplifier (PA), subsequently reducing the efficiency of the PA's operation. Second, excessive power amplifier control voltage will require an excessive amount of time to shut down the PA.

If the time required to ramp down the PA is excessive, even a few microseconds, then the PA will interfere with other PAs which are utilizing the same frequency. This interference will cause data being transmitted between the fixed site transceivers and the radiotelephones to be lost. This loss will degrade the entire radiotelephone communications system. Therefore, a power amplifier controller is needed which limits the saturation time of the PA especially at the end of the PA's transmitting time.

SUMMARY OF THE INVENTION

The present invention encompasses a transmitter having an amplifier, an amplifier controller and a first signal. The amplifier has at least two inputs and at least one output, and a saturation point. The first signal has a power level, a first frequency and coupled to an input of the amplifier. The amplifier responds to the voltage of a second signal which is coupled to the second input of the amplifier. The amplifier controller detects saturation of the amplifier at the output of the amplifier and generates the second signal, whereby the amplifier is no longer saturated.

DESCRIPTION OF A PREFERRED EMBODIMENT

Figure 1:
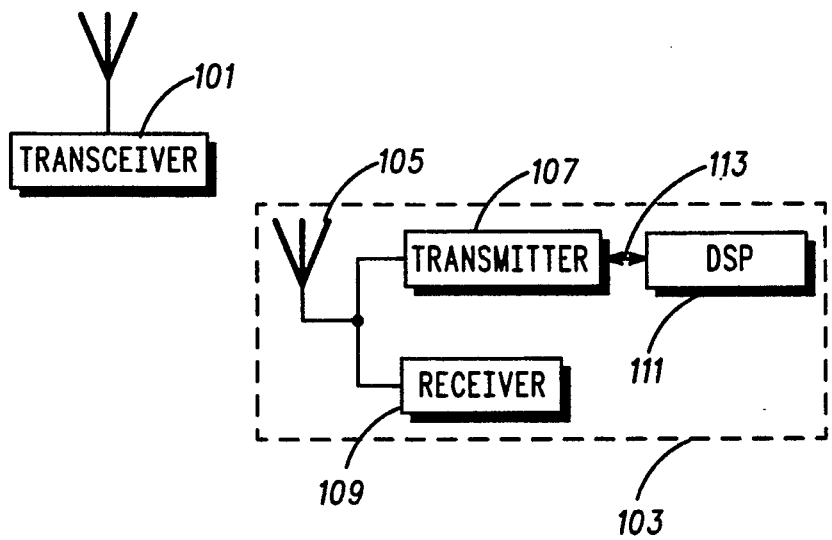
FIG. 1 is a block diagram of a radiotelephone communications system which may employ the present invention.

The invention disclosed herein, may be employed in a TDMA radiotelephone system which is illustrated in FIG. 1. In a radiotelephone system there is a fixed site transceiver 101, which sends out RF signals to portable and mobile radiotelephones contained within a geographic coverage area. One such phone is the portable radiotelephone 103. A radiotelephone system is assigned a frequency band which it is allowed to broadcast within. The frequency band is broken up into several channels 200 Kilohertz wide. Each channel is capable of handling communications between the transceiver 101 and up to 8 radiotelephones within its coverage area. Each radiotelephone is assigned time slots in which to broadcast and receive information from the transceiver 101. Each time slot is approximately 577 microseconds in duration. Portable radiotelephone 103, model number F19UVD0960AA available from Motorola, Inc., includes a transmitter 107, a receiver 109, and a digital signal processor (DSP) 111, such as the DSP 56000 available from Motorola, Inc. Several signals are transmitted between the DSP 111 and the transmitter 107 on multiple signal lines 113.

Figures 7, 8:
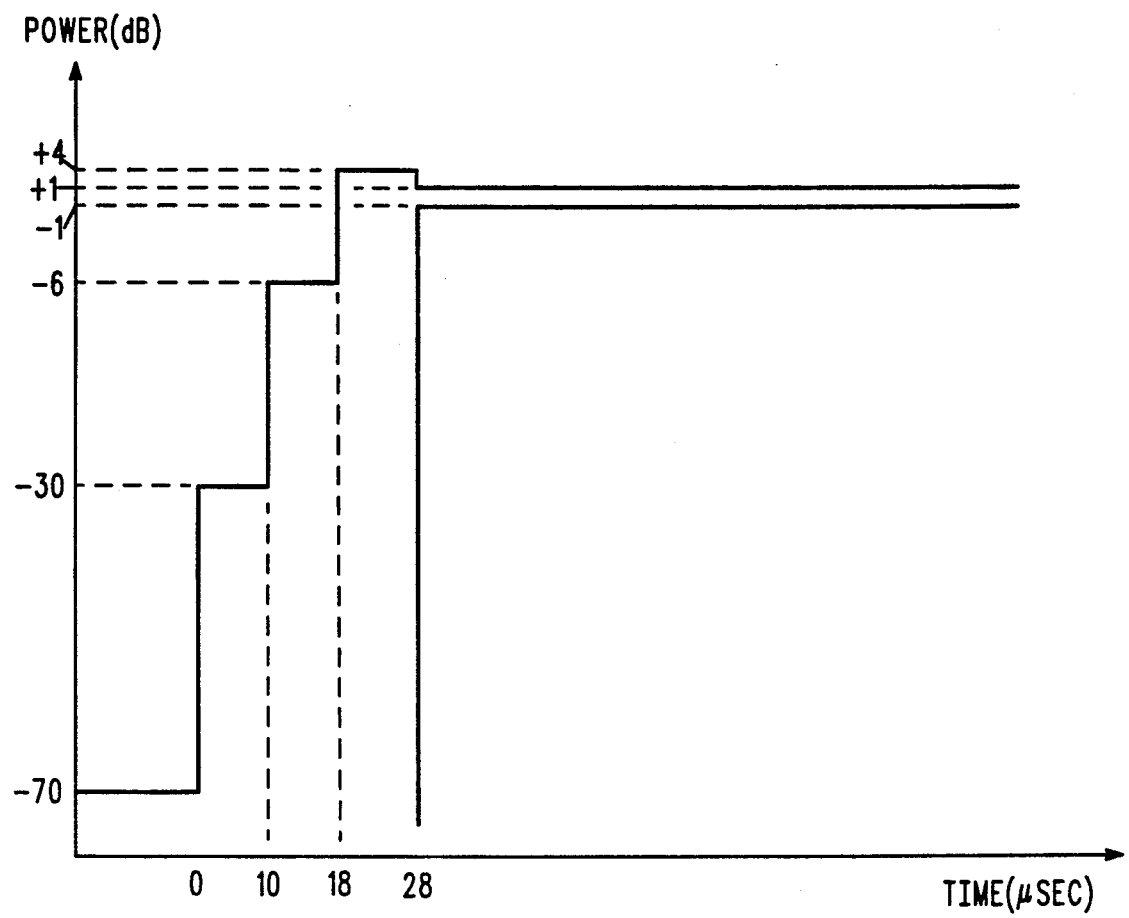
FIG. 7 is the GSM time mask as defined by GSM recommendation 05.05 (4.2.2).
FIG. 8 is the GSM spectral frequency mask as defined by GSM recommendation 05.05 (4.5.2).

The transmitter 107 and the transceiver 101 both contain power amplifiers with stringent requirements as defined by the Group Special Mobile (GSM) recommendations ETSI/PT-12 05.05 (4.2.2 and 4.5.2), March, 1991. The specifications require any transmitter to meet a time mask as shown in FIG. 7 and a spectral frequency mask as shown in FIG. 8. The antenna 105 is used to transmit and receive radio frequency signals to and from transceiver 101.

Upon receiving signals, an antenna 105 converts the signals into electrical radio frequency signals and transfers the signals to the receiver 109. The receiver 109 demodulates and converts electrical radio frequency signals into data signals usable by the rest of the portable radiotelephone 103.

Upon transmission of the radio frequency signals, the DSP 111 feeds the transmitter 107 information which is desired to be transmitted and also controlling information for the transmitter 107 via signal lines 113. The transmitter 107 takes the data and converts it into electrical radio frequency signals and gives the electrical radio frequency signals the appropriate amount of power necessary with use of the power amplifier. The antenna 105 then takes the electrical radio frequency signals and converts them into radio frequency signals and transmits them into the air for use by the transceiver 101.

Figure 2:
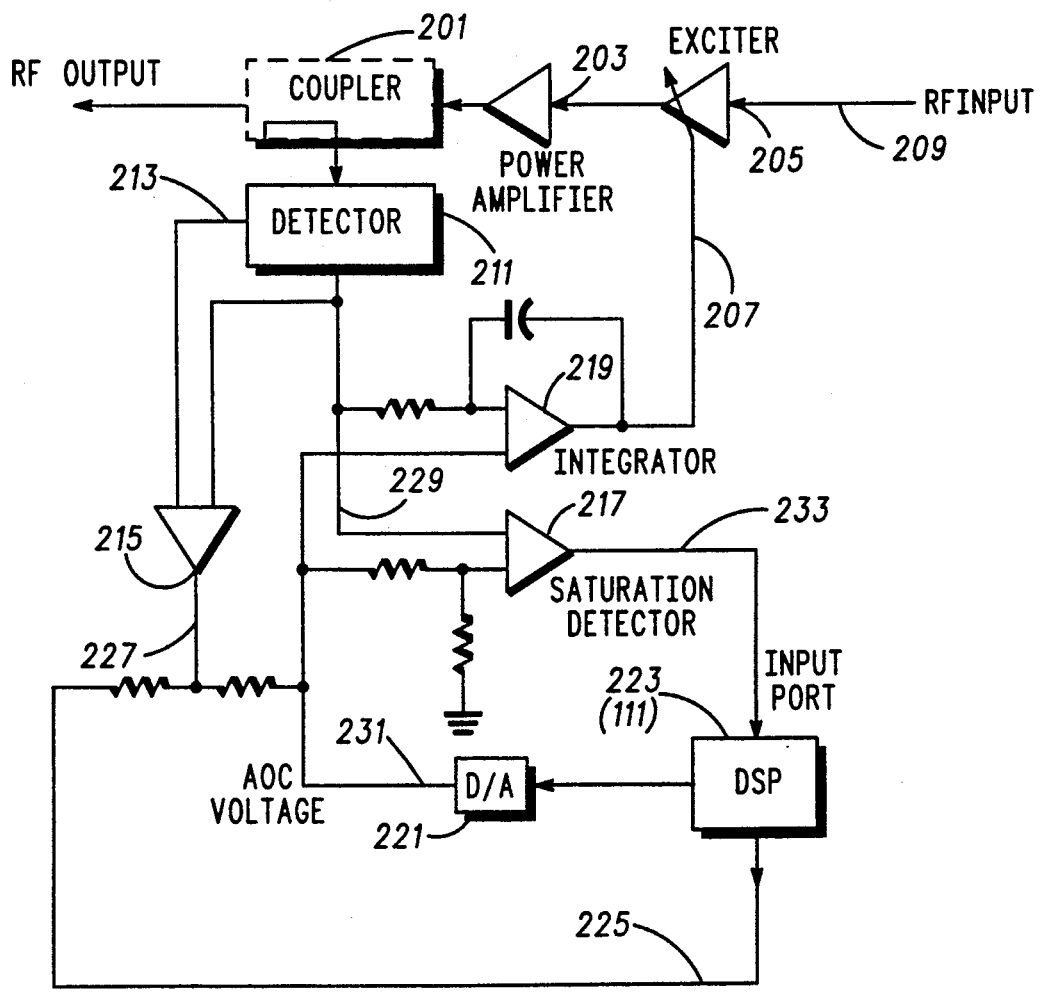
FIG. 2 is a block diagram of a power amplifier and corresponding power amplifier control circuit which may employ the present invention.

The power amplifier 203 and its associated controllers are located in the transmitter 107, and illustrated in the block diagram of FIG. 2. The function of the power amplifier 203 is to take in the radio frequency input which contains voice and data which is to be transmitted back to the fixed site transceiver 101 and amplify the RF input signals to the appropriate power level for transmission. The exciter 205 is an adjustable power amplifier which adjusts the RF input signals 209 to their proper input level for the power amplifier 203.

The block diagram of FIG. 2 contains several control loops, including the standard control loop, the ramp up loop, and the saturation detector loop of the power amplifiers. The details concerning the standard control loop and the ramp up loop can be found in U.S. patent Ser. No. 5,150,075 "Power Amplifier Ramp Up Method and Apparatus", filed on behalf of Hietala et al., on May 31, 1991 assigned to the assignee of the present invention. All of the control loops utilize the coupler 201. The coupler 201 is an electromagnetic coupler which couples the RF output signals into the control loops without causing excessive loss to the RF output signals.

The detector 211 detects the power level of the RF output signals and creates a power level signal 229 the voltage of which is responsive to the amount of power in the RF output signals. The detector 211 also outputs a reference signal 213. The voltage of the reference signal 213 is responsive to the DC offset output by the detector in absence of activity of the power amplifier 203.

The saturation control loop prevents the exciter 205 and power amplifier 203 from exceeding its amplification limit using the control signal input 207. The saturation loop consists of the coupler 201, the detector 211, the comparator 217, the digital signal processor 223 and the digital-to-analog converter 221 (D/A). The saturation detection comparator 217 compares the detector output signal 229 to the AOC voltage signal 231 to determine if the detector output signal 229 is responsive to changes in the AOC voltage signal 231. This comparison will indicate saturation from the control voltage when the voltage of the detector output signal 229 drops below the voltage of the AOC signal 231, because the detector voltage will not change with a corresponding change in the AOC voltage during saturation. The output signal 223 is input into the DSP 223. The DSP 223 contains an algorithm which steps down the voltage of the AOC signal 231 until the voltage of the AOC signal 231 drops below the saturated detector voltage 229. Then, the voltage of the AOC signal 231 can be stepped up or down. In the preferred embodiment, the voltage of the AOC signal is stepped down further to insure that the power amplifier 203 remains unsaturated, however, the voltage of the AOC signal 231 could be stepped up to become closer to the saturation threshold depending on the specific needs of a given implementation.

Figure 3:
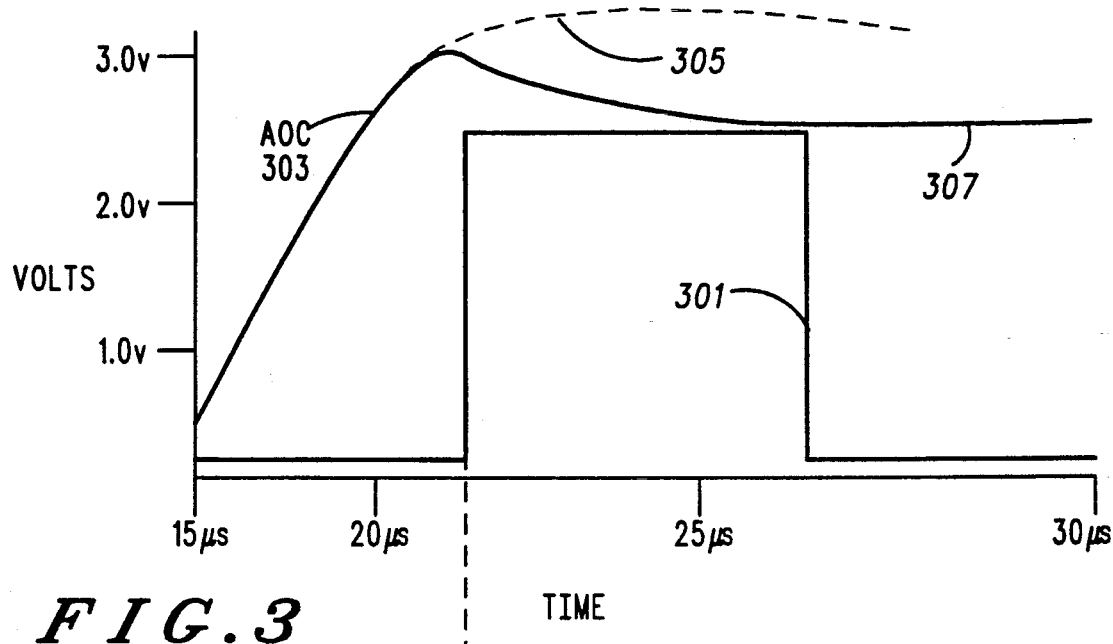
FIG. 3 is a voltage versus time graph which shows the voltage of the AOC control signal and the corresponding saturation detection signal, which may exist in the present invention.

FIG. 3 is a voltage versus time graph of the AOC control signal 231 and the saturation detection signal 233. Here, the voltage of the AOC control signal 303 is rising steadily. At approximately 22 microseconds (uS) saturation is detected in the PA 203. This saturation is detected by the comparator 217 as noted by the voltage of saturation detection signal 301 rising rapidly. Upon detection of saturation, the DSP 223 incrementally reduces the voltage of AOC control signal 231 until, at approximately 27 uS, the voltage of the AOC control signal 231 is sufficiently low to cause the power amplifier 203 to eventually come out of saturation as shown by the decrease in the voltage of the saturation detection signal 301.

The dotted signal 305 shows the path of the voltage of the AOC control signal without the present invention employed. The voltage of the AOC control signal continues into the saturated power range of the PA 203 which could cause damage and also result in a spectral frequency violation upon power down of the PA 203.

Figure 4:
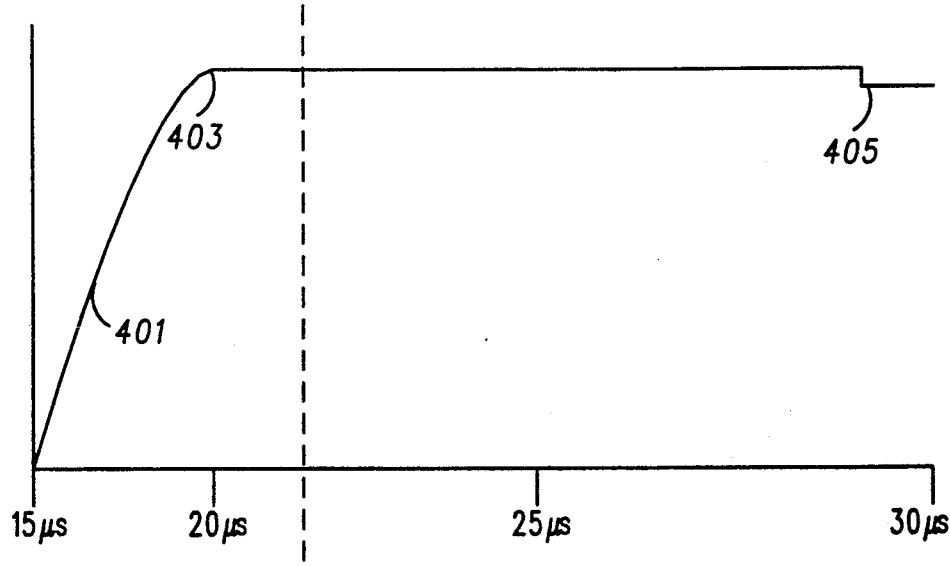
FIG. 4 is a power versus time graph which shows the desired output of a power amplifier which may employ the present invention.

FIG. 4 illustrates the power versus time of a typical power amplifier such as that shown in FIG. 2 at 203. At 401, with the present invention employed, the power rises steadily in the PA 203. At 403, the PA 203 becomes saturated at approximately 22 uS. The saturation detection control loop immediately realizes the PA 203 is saturated and warns the DSP 223. Subsequently, the DSP 223 reduces the voltage of the AOC control signal 231. At 405, the PA 203 comes out of saturation and the power is maintained slightly below the threshold of saturation for the remainder of the time slot where it ramps down smoothly.

Figure 5:
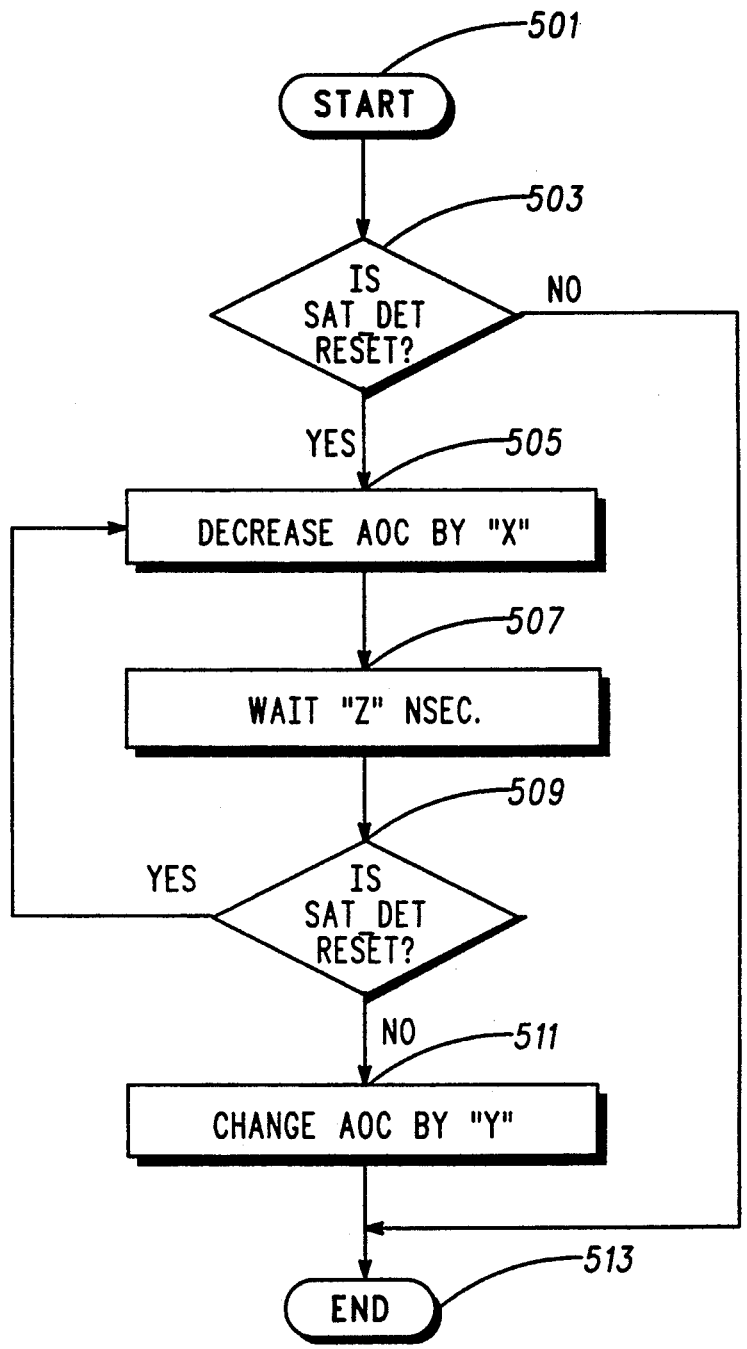
FIG. 5 is a method flow chart DSP algorithm which may employ the present invention.

FIG. 5 is a method flow chart used by the DSP 223 upon activation of the saturation detection control signal 233. Variables X Y and Z are all variable and can be set to values depending on the needs of the system.

Variable X depends on the accuracy desired of the algorithm in a given application. The smaller the variable X the more accurate the final power level will be, however, the longer it will take for the PA 203 to come out of saturation. In the preferred embodiment, the variable X is set to 2 D/A steps, which is approximately 18 millivolts.

The variable Z is the settling time required for a PA to adjust to a change in the voltage of the AOC signal. In the preferred embodiment the variable Z is set to 500 nS.

The variable Y is part of an optical step required within the algorithm. Y is the additional change in the voltage of the AOC signal after the PA has come out of saturation. The voltage of the AOC signal may be increased or decreased according to the desires of the specific application. In the preferred embodiment, the variable Y is set to 4 D/A steps which is approximately 36 millivolts. The voltage of the AOC control signal is reduced by this voltage Y to remove the PA farther from the saturation threshold.

In the preferred embodiment, the method starts at 501 when the ramp up of the PA 203 is completed. At 503, the DSP checks the status of the saturation detection signal 233. If the saturation detection signal 233 is high, signifying that the PA 203 is saturated, then the algorithm proceeds to step 505. If the saturation detection signal 233 is low, the algorithm proceeds to step 513. At 505, the voltage of the AOC control signal 231 is reduced by a predetermined increment X. At 507, the algorithm waits a predetermined number of nanoseconds, Z, until the PA 203 adjusts its power to the newly created AOC voltage. At 509, the DSP 223 checks the status of the saturation detection signal 233. If the saturation detection signal 233 is still high, then the algorithm returns to step 505. If the saturation detection signal 233 is low, signifying that the PA 203 is no longer saturated, then the algorithm continues to step 511. At 511, the voltage of the AOC control signal 231 is changed by a predetermined increment Y. The change may be either an increase or a decrease in voltage, depending upon the needs of the system. In the preferred embodiment, the voltage is decreased by the predetermined increment Y. At 513, the method ends.

Figure 6:
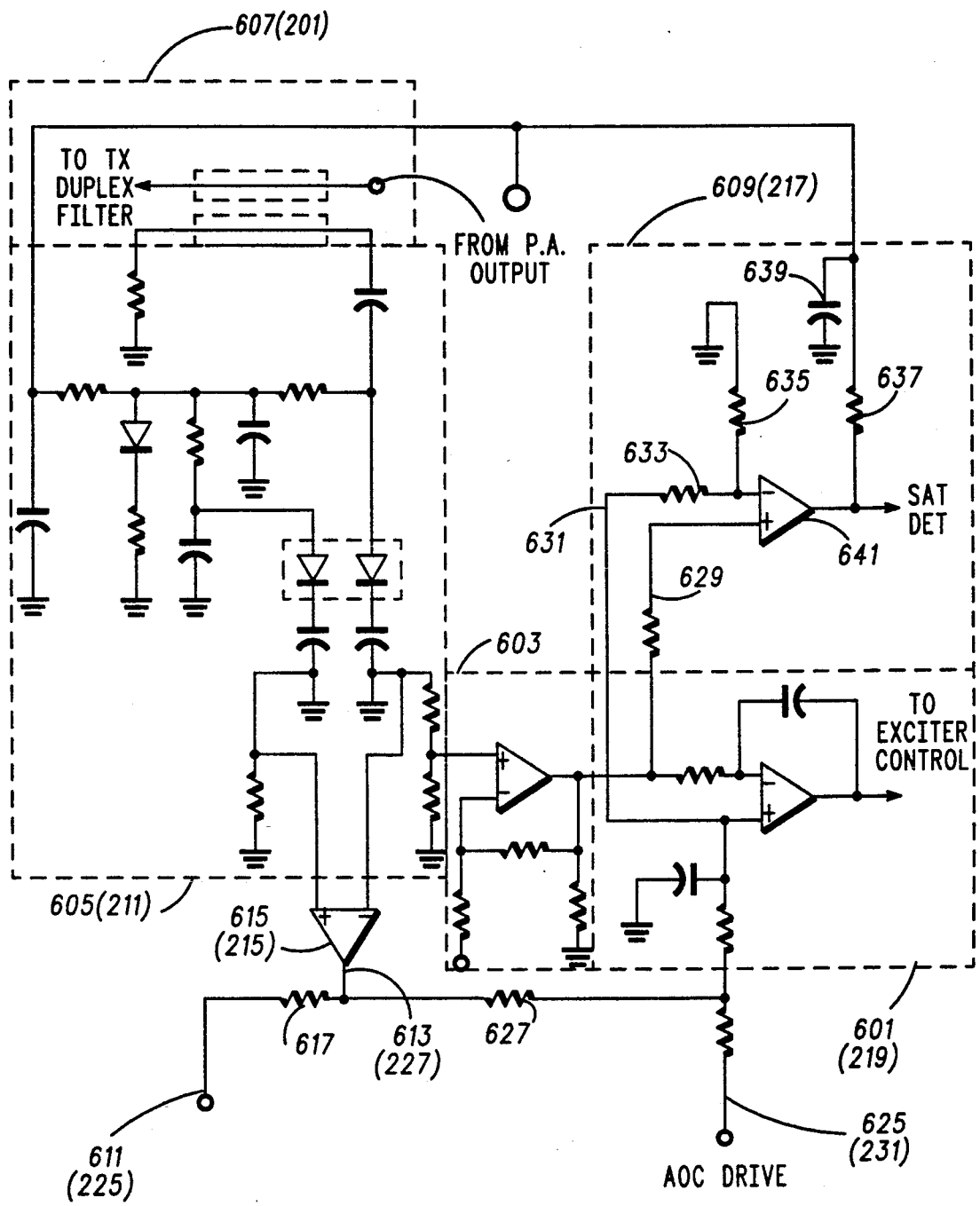
FIG. 6 is a schematic diagram of a power amplifier control circuit which may employ the present invention.

FIG. 6 is a schematic diagram of the PA 203 control circuit which includes the saturation detection control loop. The circuit contains the coupler 607, the detector 605, the integrator 601, the power range controller 603 and the saturation detection circuit 609. Saturation detection circuit compares the AOC voltage control signal 631 to the detector output voltage signal 629 at comparator 641. Upon detection that the AOC voltage is greater than the detector voltage the saturation detection signal 233 goes high, this is reported to the DSP 223 so that the saturation detection algorithm illustrated in FIG. 5 may be used to reduce the voltage of the AOC control signal.

Saturation detection at the output of the detector 605 is preferred over detection at the output of the integrator 219. If the saturation detection was at the output of the integrator 219, then the delay associated with the integrator 219 would cause the output power to ramp down much farther than desired before the saturation detector indicates that saturation has been corrected. Thus, detection of saturation at the output of the integrator 219 would be inefficient use of the PA 203, and would not meet the GSM time mask illustrated in FIG. 7.

Therefore, with the use of the saturation detection comparator 217, comparing the voltage of the AOC control signal 231 and the voltage of the detector output signal 229 one can determine that the PA 203 is saturated. Using the DSP 223 and the algorithm illustrated in FIG. 5 within the DSP 223 the PA 203 can be brought to the threshold of saturation to prevent damage to the PA 203 and also to prevent violation of the spectral time and frequency masks illustrated in FIGS. 7 and 8.

What is claimed is:

1. A transmitter containing inter alia means for amplifying a first signal and means for controlling the means for amplifying, the means for amplifying having a first and a second input, a first output, a magnitude of amplification and a saturation point, the first signal having a power level, a first frequency and coupled to the first input of the means for amplifying, the magnitude of amplification of the means for amplifying responsive to a voltage of a second signal coupled to the second input of the means for amplifying, the means for controlling comprising:

means for detecting saturation of the means for amplifying, said means for detecting coupled to the first output of the means for amplifying; and means for setting the magnitude of amplification of the means for amplifying, said means for setting coupled to an output of said means for detecting and coupled to the second input of the means for amplifying, said means for setting further comprising:

means for generating, in absence of detecting saturation, the second signal having voltage equal to the current voltage of the second signal; and means for generating, while detecting saturation, the second signal having voltage equal to the current voltage of the second signal less a predetermined increment, until the means for amplifying is no longer saturated.

2. A transmitter containing inter alia means for amplifying a first signal and means for controlling the means for amplifying, the means for amplifying having a first and a second input, and a first output and having a saturation point, the first signal having a power level, a first frequency and coupled to the first input of the means for amplifying, the means for amplifying responsive to a voltage of a second signal coupled to the second input of the means for amplifying, the means for controlling comprising:

means for detecting saturation of the means for amplifying, said means for detecting coupled to the first output of the means for amplifying; and means for generating the second signal responsive to said means for detecting saturation, such that the means for amplifying is no longer saturated, said means for generating the second signal comprises a digital signal processor and a digital to analog converter coupled to an output of said means for detecting and coupled to the second input of the means for amplifying.

3. A method of controlling an amplifier, the amplifier having at least a first and a second input, an output, a saturation point and amplifying a first signal responsive to the voltage of a second signal, the first signal having a power level, a first frequency and coupled to the first input of the amplifier, the second signal coupled to a second input of the amplifier the method of controlling the amplifier comprising the steps of:

- detecting the power level of the first amplified signal at the output of the amplifier and generating a fifth signal indicating the detected power level;
- determining a difference between the fifth signal and a third signal, the third signal generated to control the power level of the amplifier;
- generating a fourth signal corresponding to said difference and indicating saturation of the amplifier or absence thereof;
- generating, in absence of saturation, the second signal in accordance with the third signal; and
- generating, while indicating saturation, the second signal having a voltage equal to said third signal less a predetermined increment.

4. A method of controlling an amplifier in accordance with claim 3 wherein said step of generating the second signal having a voltage equal to said third signal less a predetermined increment further comprise the steps of:

- determining said fourth signal corresponds to the saturation of the amplifier;
- decreasing, responsive to determining saturation, the second signal by a first predetermined increment;
- waiting a second predetermined increment;
- determining said fourth signal does not correspond to the saturation of the amplifier; and
- changing said second signal by a third predetermined increment.

5. An improved amplifier and control circuit for controlling amplifier saturation comprising:

- means for amplifying a first signal, forming a first amplified signal having a power level, said means for amplifying having a magnitude of amplification;
- means for detecting a power level of said first amplified signal and generating a second signal having a voltage indicative of said detected power level;
- means for comparing the voltage of the second signal and a voltage of a third signal, generating a saturation detection signal indicating the presence or absence of saturation in the means for amplifying; and
- means, responsive to the saturation detection signal, for setting the magnitude of amplification of the means for amplifying coupled to the means for amplifying, the means for setting comprising:
  - means, in absence of saturation, for generating the third signal having a voltage equal to the voltage of the second signal, and
  - means, in presence of saturation, for generating the third signal having a voltage equal to the voltage of the second signal less a predetermined increment.

6. An improved amplifier and control circuit in accordance with claim 5 wherein said means for generating the third signal is a digital signal processor and a digital to analog converter.

7. An improved amplifier and control circuit in accordance with claim 5 wherein said means for detecting saturation is a differential amplifier.

* * * * *